(12) United States Patent
Yang et al.

(10) Patent No.: US 9,373,727 B2
(45) Date of Patent: Jun. 21, 2016

(54) SEMICONDUCTOR DIODE

(75) Inventors: Ming-Tzong Yang, Baoshan Township, Hsinchu County (TW); Tung-Hsing Lee, Lujhou (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 13/168,311

(22) Filed: Jun. 24, 2011

(65) Prior Publication Data
US 2012/0326263 A1    Dec. 27, 2012

(51) Int. Cl.
H01L 21/70   (2006.01)
H01L 29/861  (2006.01)
H01L 29/417  (2006.01)
H01L 29/45   (2006.01)

(52) U.S. Cl.
CPC ............ *H01L 29/861* (2013.01); *H01L 29/417* (2013.01); *H01L 29/45* (2013.01)

(58) Field of Classification Search
CPC ........................................................ H01L 21/70
USPC ............ 257/288, E27.051; 333/104; 327/504
See application file for complete search history.

(56) References Cited

U.S. PATENT DOCUMENTS 6,008,684 A * 12/1999 Ker et al. ........................ 327/428
6,060,752 A *  5/2000 Williams ........................ 257/355
2005/0212051 A1 *  9/2005 Jozwiak et al. ................ 257/355
2007/0102724 A1    5/2007 Kumar et al.
2007/0176252 A1 *  8/2007 Coolbaugh et al. ........... 257/458
2009/0218601 A1 *  9/2009 Stephan et al. ................ 257/252

FOREIGN PATENT DOCUMENTS

| CN | 101305469 | 11/2008 |
| CN | 101952947 | 1/2011 |
| TW | 200731547 | 11/2007 |
| WO | WO 2009/047191 | 4/2009 |

* cited by examiner

*Primary Examiner* — Marvin Payen
(74) *Attorney, Agent, or Firm* — McClure, Qualey & Rodack, LLP

(57) ABSTRACT

A semiconductor diode includes a semiconductor substrate having a lightly doped region with a first conductivity type therein. A first heavily doped region with a second conductivity type opposite to the first conductivity type is in the lightly doped region. A second heavily doped region with the first conductivity type is in the lightly doped region and is in direct contact with the first heavily doped region. A first metal silicide layer is on the semiconductor substrate and is in direct contact with the first heavily doped region. A second metal silicide layer is on the semiconductor substrate and is in direct contact with the second heavily doped region. The second metal silicide layer is spaced apart from the first metal silicide layer.

16 Claims, 1 Drawing Sheet

SEMICONDUCTOR DIODE

BACKGROUND OF THE INVENTION

1. Field of the Invention

The invention relates to a semiconductor device and more particularly to a semiconductor diode with reduced power loss.

2. Description of the Related Art

A semiconductor diode is a well known electronic component that restricts the direction of flow of charge carriers. The semiconductor diode allows an electric current to flow in an intended direction, but substantially blocks current flow in an opposite direction with respect to the intended direction. Without diodes, most electronic devices would simply not operate.

The most common semiconductor diodes are p-n junction diodes made of semiconductor material, such as silicon, Gallium Arsenide (GaAs) or silicon carbide (SiC), with impurity elements introduced therein to modify the operating characteristics thereof. P-n junction diodes are widely used for low voltage switching, power supply, power convert and related applications. As is well known in the art, such a p-n junction diode blocks current when the cathode (n-side) is made positive with respect to the anode (p-side) until the cathode voltage is high enough to cause a breakdown. In the reverse bias mode of operation, the current from the cathode to the anode is very low and is called leakage current. When the anode is made positive with respect to the cathode, the mode of the operation is referred to as a forward bias (the voltage across the diode is referred to as the forward bias voltage). The current from the anode to the cathode is increased with increased forward bias voltage. The effect of this rise in current, switches the diode to an ON state, when a threshold voltage (or turn on voltage) is reached. When the turn voltage is surpassed, current increases significantly.

Typically, diodes require a turn on voltage of about 0.7 Volts, and diodes dissipate power in proportion to this forward voltage. Many household electronic devices, such as televisions, microwave ovens or the likes, are powered by household voltages and thus they can tolerate a power loss of the diodes in the circuit. This power loss, however, cannot be tolerated as well by battery powered electronic devices, such as a laptop computer, a mobile phone, a digital camera, and the like because this power loss directly reduces battery life, thereby impacting the usability of the electronic device. As sizes of semiconductor devices continuously shrink, along with increased device density in the integrated circuits, the power loss problem for integrated circuits worsens.

Accordingly, there is a need to develop a novel semiconductor diode design which is capable of mitigating the aforementioned problems.

BRIEF SUMMARY OF THE INVENTION

An exemplary embodiment of a semiconductor diode comprises a semiconductor substrate having a lightly doped region with a first conductivity type therein. A first heavily doped region with a second conductivity type opposite to the first conductivity type is in the lightly doped region. A second heavily doped region with the first conductivity type is in the lightly doped region and is in direct contact with the first heavily doped region. A first metal silicide layer is on the semiconductor substrate and is in direct contact with the first heavily doped region. A second metal silicide layer is on the semiconductor substrate and is in direct contact with the second heavily doped region. The second metal silicide layer is spaced apart from the first metal silicide layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
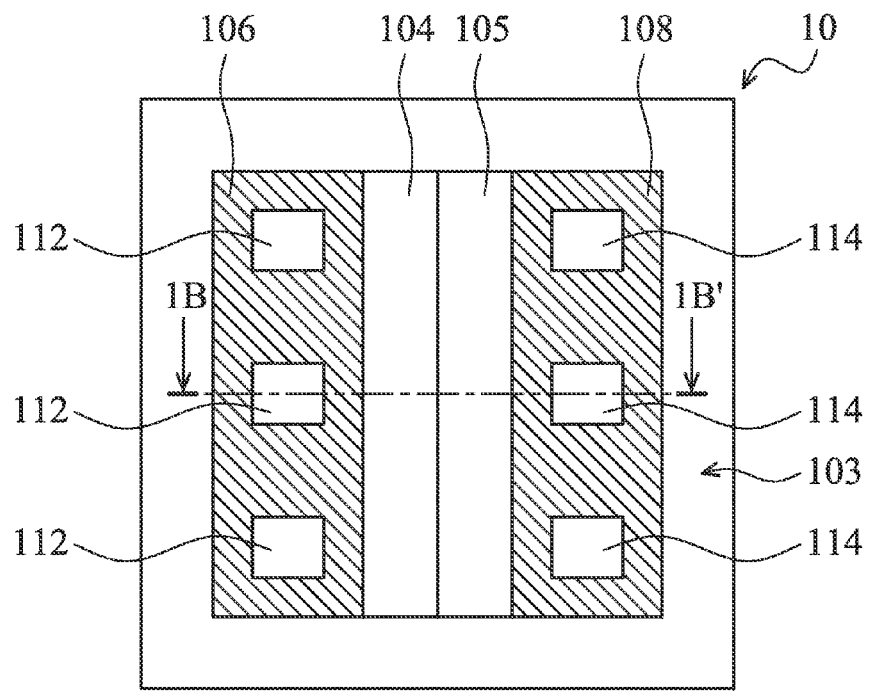
FIG. 1A shows a plan view of an exemplary embodiment of a semiconductor diode according to the invention.

The following description encompasses the fabrication process and the purpose of the invention. It can be understood that this description is provided for the purpose of illustrating the fabrication process and the use of the invention and should not be taken in a limited sense. In the drawings or disclosure, the same or similar elements are represented or labeled by the same or similar symbols. Moreover, the shapes or thicknesses of the elements shown in the drawings may be magnified for simplicity and convenience. Additionally, the elements not shown or described in the drawings or disclosure are common elements which are well known in the art.

Figure 1B:
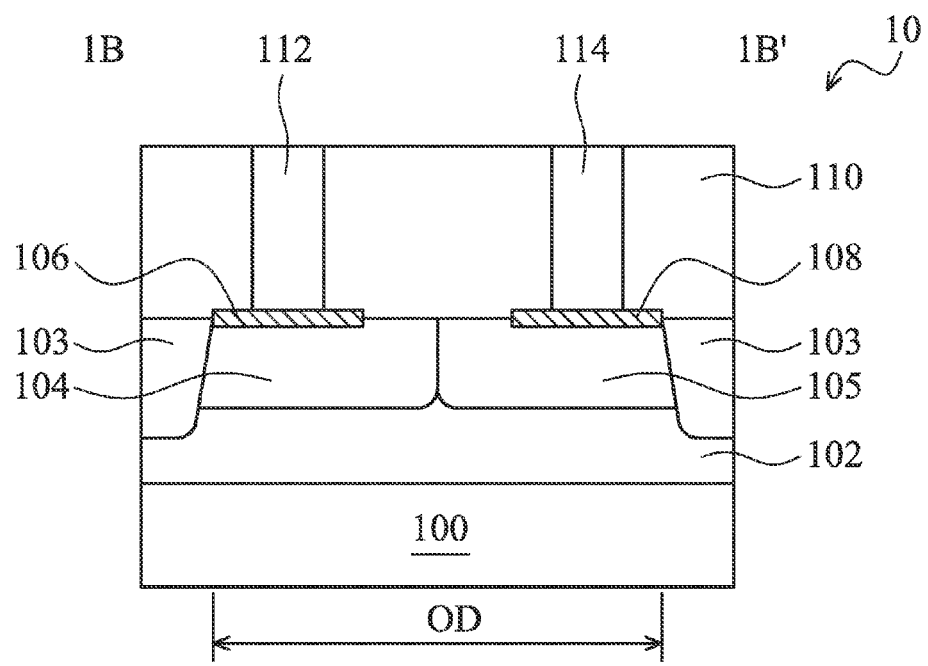
FIG. 1B shows a cross section along line 1B-1B' of FIG. 1A.

Referring to FIGS. 1A and 1B, which respectively illustrate a plan view of an exemplary embodiment of a semiconductor diode 10 according to the invention and a cross section along line 1B-1B' of FIG. 1A. The semiconductor diode 10 may be implemented as a p-n junction diode. The semiconductor diode 10 comprises a semiconductor substrate 100. The semiconductor substrate 100 may comprise silicon or other group III, group IV, and/or or group V elements. A lightly doped region (which is also referred as to lightly doped well region or well region) 102 with a first conductive type, such as n-type or p-type is formed in the semiconductor substrate 100 by, for example, an implanting process or other well known doping processes. In the embodiment, the semiconductor substrate 100 may have a second conductivity type opposite to the first conductive type of the lightly doped well region 102. For example, the second conductivity type of the semiconductor substrate 100 is p-type and the first conductivity type of the lightly doped well region 102 is n-type. Moreover, the lightly doped well region 102 may be formed by implanting phosphorous or arsenic therein. In another embodiment, the lightly doped well region 102 may be formed by growing an epitaxial semiconductor layer on the semiconductor substrate 100, followed by performing an n-type impurity implantation process thereto.

An isolation structure 103 is formed in the lightly doped well region 102 of the semiconductor substrate 100 to define an active area OD therein. In the embodiment, a shallow trench isolation (STI) may be used as the isolation structure 103, although a well known local oxidation of silicon (LOCOS) may also be applicable.

A first heavily doped region 104 with the second conductivity type as that of the semiconductor substrate 100 and a second heavily doped region 105 with the first conductivity type as that of the lightly doped well region 102 are formed in the lightly doped well region 102 and correspond to the active area OD, wherein the second heavily doped region 105 is in direct contact with the first heavily doped region 104 to form a p-n junction of the semiconductor diode 10, and both of the first and second heavily doped regions 104 and 105 are surrounded by a ring formed by the isolation structure 103, as shown in the top view of FIG. 1A. In the embodiment, the first and second heavily doped regions 104 and 105 may be formed by different ion implantation processes.

A first metal silicide layer 106 and a second metal silicide layer 108 are disposed on the lightly doped well region 102 of the semiconductor substrate 100 and are in direct contact with the first and second heavily doped regions 104 and 105, respectively. In one embodiment, the first metal silicide layer 106 and the second metal silicide layer 108 may comprise nickel silicide. Alternatively, the first metal silicide layer 106 and a second metal silicide layer 108 may comprise other suitable metal silicides, such as titanium silicide, cobalt silicide, tantalum silicide, platinum silicide or combinations thereof.

The first metal silicide layer 106 and the second metal silicide layer 108 may be formed by a conventional silicidation process. For example, a resist protective oxide (RPO) layer (not shown) may be deposited on the semiconductor substrate 100 prior to formation of any metal silicide layer, and then the RPO layer may be selectively removed where silicidation is desired. A metal layer (not shown) is selectivity formed on the lightly doped well region 102 corresponding to the active area OD and uncovered by the RPO layer. A high temperature annealing process may be performed to the metal layer, such that the metal layer reacts with the underlying semiconductor substrate 100 to form the first metal silicide layer 106 in direct contact with the heavily doped region 104 and the second metal silicide layer 108 in direct contact with the second heavily doped region 105. The RPO layer is finally removed, such that the first metal silicide layer 106 is spaced apart from the second metal silicide layer 108.

An interlayer dielectric (ILD) layer 110 (which is not shown in FIG. 1A) is disposed on the semiconductor substrate 100 and may be composed of oxide, nitride, oxynitride, or combinations thereof, or low k material, such as fluorinated silicate glass (FSG), carbon doped oxide, methyl silsesquioxane (MSQ), hydrogen silsesquioxane (HSQ), or fluorine tetra-ethyl-orthosilicate (FTEOS), which serves as an interlayer dielectric (ILD) layer. The ILD layer 110 may be formed by, for example, chemical vapor deposition (CVD), low pressure chemical vapor deposition (LPCVD), plasma enhanced chemical vapor deposition (PECVD), high density plasma chemical vapor deposition (HDPCVD) or other deposition processes well known in the art.

First and second metal contacts 112 and 114 are disposed in the ILD layer 110 and in direct contact with the first metal silicide layer 106 and the second metal silicide layer 108, respectively, for electrical connections, wherein the first and second metal contacts 112 and 114 serve as terminals of the semiconductor diode 10. In one embodiment, the first and second metal contacts 112 and 114 may comprise tungsten, although other suitable metals, such as aluminum, copper or combinations thereof are also applicable. The first and second metal contacts 112 and 114 may be formed by performing a via hole etching process in the ILD layer 110 and then filling metal into the via holes. Metal layers (not shown) are disposed on the ILD layer 110 and are electrically connected to the respective first and second metal contacts 112 and 114, thereby electrically connecting the semiconductor diode 10 to other semiconductor devices or circuits (not shown).

According to the embodiment, since the metal contact is in direct contact with the metal silicide layer that has a higher conductivity compared to the heavily doped regions of the semiconductor diodes, the contact resistance of the heavily doped regions of the semiconductor diodes can be reduced, thereby mitigating the power loss of the semiconductor diodes. Moreover, since the silicide layer between the metal contact and the corresponding heavily doped region can mitigate damage at the metal/semiconductor interface caused by overetching during contact formation, the reliability and stability of the semiconductor diode can be enhanced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor diode, comprising:
    a semiconductor substrate having a lightly doped region with a first conductivity type therein;
    a first heavily doped region with a second conductivity type opposite to the first conductivity type in the lightly doped region;
    a second heavily doped region with the first conductivity type in the lightly doped region and in direct physical contact with the first heavily doped region, wherein the first heavily doped region is adjacent to the second heavily doped region, and wherein a top portion of the first or second heavily doped region is in the lightly doped region;
    a first metal silicide layer on the semiconductor substrate and in direct contact with the first heavily doped region; and
    a second metal silicide layer on the semiconductor substrate and in direct contact with the second heavily doped region, wherein the second metal silicide layer is spaced apart from the first metal silicide layer.

2. The semiconductor diode of claim 1, further comprising an isolation structure in the semiconductor substrate and surrounding the first and second heavily doped regions.

3. The semiconductor diode of claim 2, wherein the isolation structure is a shallow trench isolation structure.

4. The semiconductor diode of claim 1, further comprising a first metal contact in direct contact with the first metal silicide layer and a second metal contact in direct contact with the second metal silicide layer.

5. The semiconductor diode of claim 4, wherein the first and second metal contact comprise tungsten.

6. The semiconductor diode of claim 1, wherein the first and second metal silicide layers comprise nickel silicide.

7. The semiconductor diode of claim 1, wherein the first conductivity type is n-type and the second conductivity type is p-type.

8. The semiconductor diode of claim 1, wherein the first conductivity type is p-type and the second conductivity type is n-type.

9. A semiconductor diode, comprising:
    a semiconductor substrate having a lightly doped region with a first conductivity type therein;
    a first heavily doped region with a second conductivity type opposite to the first conductivity type in the lightly doped region;
    a second heavily doped region with the first conductivity type in the lightly doped region and in direct physical contact with the first heavily doped region, wherein the first heavily doped region is adjacent to the second heavily doped region, and wherein a top portion of the first or second heavily doped region is in the lightly doped region;
    an isolation structure in the semiconductor substrate, wherein a depth of the first or second heavily doped region is less than a depth of the isolation structure;

a first metal silicide layer on the semiconductor substrate and in direct contact with the first heavily doped region; and a second metal silicide layer on the semiconductor substrate and in direct contact with the second heavily doped region, wherein the second metal silicide layer is spaced apart from the first metal silicide layer.

10. The semiconductor diode of claim 9, wherein the isolation structure surrounds the first and second heavily doped regions.

11. The semiconductor diode of claim 9, wherein the isolation structure is a shallow trench isolation structure.

12. The semiconductor diode of claim 9, further comprising a first metal contact in direct contact with the first metal silicide layer and a second metal contact in direct contact with the second metal silicide layer.

13. The semiconductor diode of claim 12, wherein the first and second metal contact comprise tungsten.

14. The semiconductor diode of claim 9, wherein the first and second metal silicide layers comprise nickel silicide.

15. The semiconductor diode of claim 9, wherein the first conductivity type is n-type and the second conductivity type is p-type.

16. The semiconductor diode of claim 9, wherein the first conductivity type is p-type and the second conductivity type is n-type.

* * * * *